United States Patent
Nishizawa

(10) Patent No.: US 11,244,874 B2
(45) Date of Patent: Feb. 8, 2022

(54) SUBSTRATE BONDING STRUCTURE AND SUBSTRATE BONDING METHOD

(71) Applicant: Mitsubishi Electric Corporation, Tokyo (JP)

(72) Inventor: Koichiro Nishizawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/763,666

(22) PCT Filed: Mar. 16, 2018

(86) PCT No.: PCT/JP2018/010522
§ 371 (c)(1),
(2) Date: May 13, 2020

(87) PCT Pub. No.: WO2019/176095
PCT Pub. Date: Sep. 19, 2019

(65) Prior Publication Data
US 2020/0365473 A1    Nov. 19, 2020

(51) Int. Cl.
*H01L 21/50*    (2006.01)
*H01L 23/04*    (2006.01)
(Continued)

(52) U.S. Cl.
CPC ............ *H01L 23/041* (2013.01); *H01L 21/50* (2013.01); *H01L 23/10* (2013.01); *H01L 24/05* (2013.01);
(Continued)

(58) Field of Classification Search
CPC ....... H01L 23/041; H01L 21/50; H01L 23/10; H01L 24/05; H01L 24/73; H01L 2224/13582; H05K 3/36
(Continued)

(56) References Cited

U.S. PATENT DOCUMENTS

2005/0167795 A1    8/2005  Higashi
2009/0091018 A1    4/2009  Maeda et al.
(Continued)

FOREIGN PATENT DOCUMENTS

JP    2004209585 A    7/2004
JP    2007160499 A    6/2007
(Continued)

OTHER PUBLICATIONS

International Search Report; Written Opinion; and Notification of Transmittal of The International Search Report and the Written Opinion of the International Searching Authority, or the Declaration issued in PCT/JP2018/010522; dated May 15, 2018.
(Continued)

*Primary Examiner* — Elias Ullah
(74) *Attorney, Agent, or Firm* — Studebaker & Brackett PC

(57) ABSTRACT

A device (2) is formed on a main surface of a substrate (1). The main surface of the substrate (1) is bonded to the undersurface of the counter substrate (14) via the bonding member (11,12,13) in a hollow state. A circuit (17) and a bump structure (26) are formed on the top surface of the counter substrate (14). The bump structure (26) is positioned in a region corresponding to at least the bonding member (11,12,13), and has a higher height than that of the circuit (17).

10 Claims, 12 Drawing Sheets

(51) Int. Cl.
    *H01L 23/10*           (2006.01)
    *H01L 23/00*           (2006.01)
    *H05K 3/36*            (2006.01)

(52) U.S. Cl.
    CPC .............. *H01L 24/13* (2013.01); *H01L 24/73* (2013.01); *H05K 3/36* (2013.01); *H01L 2224/13582* (2013.01)

(58) Field of Classification Search
    USPC ........................................................ 257/678
    See application file for complete search history.

(56) References Cited

U.S. PATENT DOCUMENTS

| | | |
|---|---|---|
| 2010/0059897 A1 | 3/2010 | Fay et al. |
| 2010/0267176 A1 | 10/2010 | Liu et al. |
| 2014/0077391 A1 | 3/2014 | Kikuchi et al. |
| 2018/0138132 A1 | 5/2018 | Nishizawa et al. |
| 2018/0151530 A1* | 5/2018 | Chen ..................... H01L 24/19 |

FOREIGN PATENT DOCUMENTS

| | | |
|---|---|---|
| JP | 2009285810 A | 12/2009 |
| JP | 2014060202 A | 4/2014 |
| JP | 2017121701 A | 7/2017 |
| JP | 6237969 B1 | 11/2017 |
| TW | 201017852 A | 5/2010 |
| TW | 201039430 A | 11/2010 |
| WO | 2017029822 A1 | 2/2017 |

OTHER PUBLICATIONS

Office Action issued in TW 107113702; mailed by the Taiwan Intellectual Property Office dated Aug. 17, 2018.

* cited by examiner

SUBSTRATE BONDING STRUCTURE AND SUBSTRATE BONDING METHOD

FIELD

The present invention relates to a structure in which a substrate and a counter substrate are bonded together, and a method for bonding the substrates.

BACKGROUND

In order to reduce the mounting area of a semiconductor device, there is proposed a structure in which a semiconductor substrate is bonded to another semiconductor substrate or a substrate of other than a semiconductor such as glass or sapphire. Further, in order to enhance reliability, there is also proposed a structure in which a sealing frame is provided between substrates to form a hollow part (refer to Patent Literature 1, for example).

As a substrate bonding method, there is a method called wafer level chip scale package (WLCSP) in which a substrate in a wafer state and a counter substrate are bonded together and separated by dicing for each device. For example, devices are formed in an array form on a substrate by a wafer process, circuits corresponding to the devices are also formed on a counter substrate, and both are joined via connection bumps. In this method, many devices can be formed at once, and the cost is lower than in the case of individually packaging.

CITATION LIST

Patent Literature

[PTL 1] JP 2009-285810 A

SUMMARY

Technical Problem

The substrate and the counter substrate are aligned, and are bonded by applying pressure uniformly from above and below using surface plates. At this time, the counter substrate receives downward pressure for each element such as a circuit formed on the top surface, and therefore, the circuits or the like on the counter substrate may be damaged. Further, the pressure from the upper side is dispersed and transmitted to the connection bumps by changing the direction, and therefore, it is not possible to transmit sufficient pressure directly downward to the connection bumps. Accordingly, in some cases, adhesion of the connection bumps is deteriorated, and electrical conduction is not able to be obtained. As a result, there is a problem that reliability is impaired.

The present invention has been made in the light of the problem as described above, and it is an object of the present invention to obtain a substrate bonding structure and a substrate bonding method that can enhance reliability.

Solution to Problem

A substrate bonding structure according to the present disclosure includes: a substrate having a main surface; a device formed on the main surface of the substrate; a counter substrate having an undersurface facing the main surface and a top surface opposite to the undersurface; a bonding member bonding the main surface of the substrate to the undersurface of the counter substrate in a hollow state; and a circuit and a bump structure formed on the top surface of the counter substrate, wherein the bump structure is positioned in a region corresponding to at least the bonding member, and has a higher height than that of the circuit.

Advantageous Effects of Invention

In the present disclosure, a circuit and a bump structure are formed on the top surface of the counter substrate, and the bump structure is positioned in a region corresponding to at least the bonding member, and has a higher height than that of the circuit. Accordingly, when the substrate and the counter substrate are bonded together, the circuit having a low height does not contact the surface plate, and therefore the circuit can be protected. Further, a load from the surface plate on the upper side is not dispersed to the circuit, but transmitted linearly to the connection bumps and the sealing frame via the bump structure. Accordingly, a sufficient load can be applied, and therefore, adhesion of the counter substrate and the bonding member can be ensured. As a result, reliability can be enhanced.

DESCRIPTION OF EMBODIMENTS

A substrate bonding structure and a substrate bonding method according to the embodiments of the present disclosure will be described with reference to the drawings. The same components will be denoted by the same symbols, and the repeated description thereof may be omitted.

Embodiment 1

Figure 1:
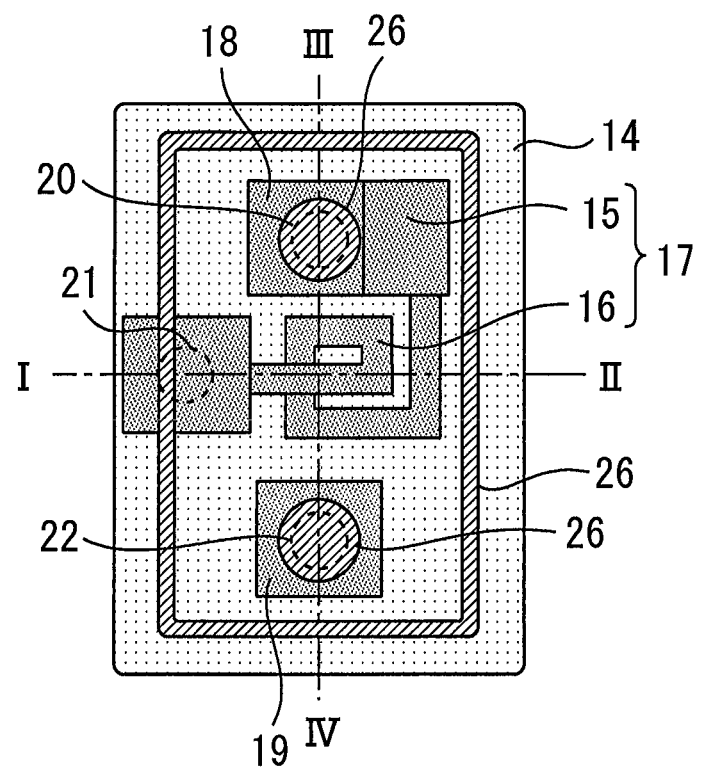
FIG. 1 is a top view illustrating a substrate bonding structure according to embodiment 1.
Figure 2:
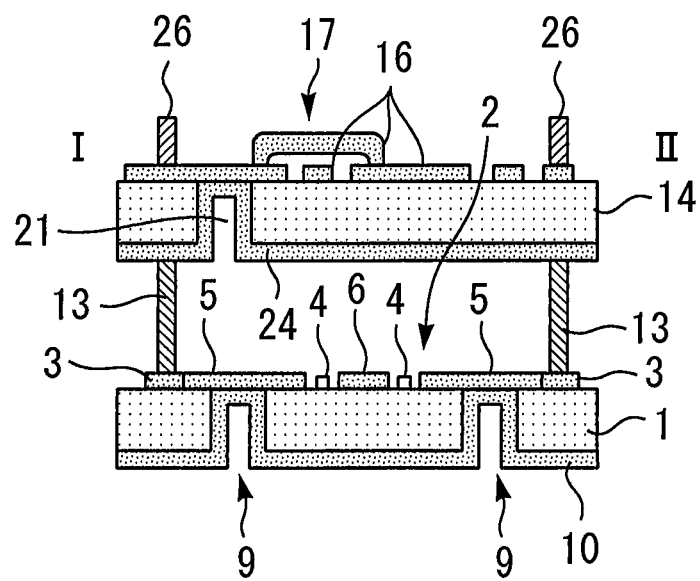
FIG. 2 is a sectional view along I-II in FIG. 1.
Figure 3:
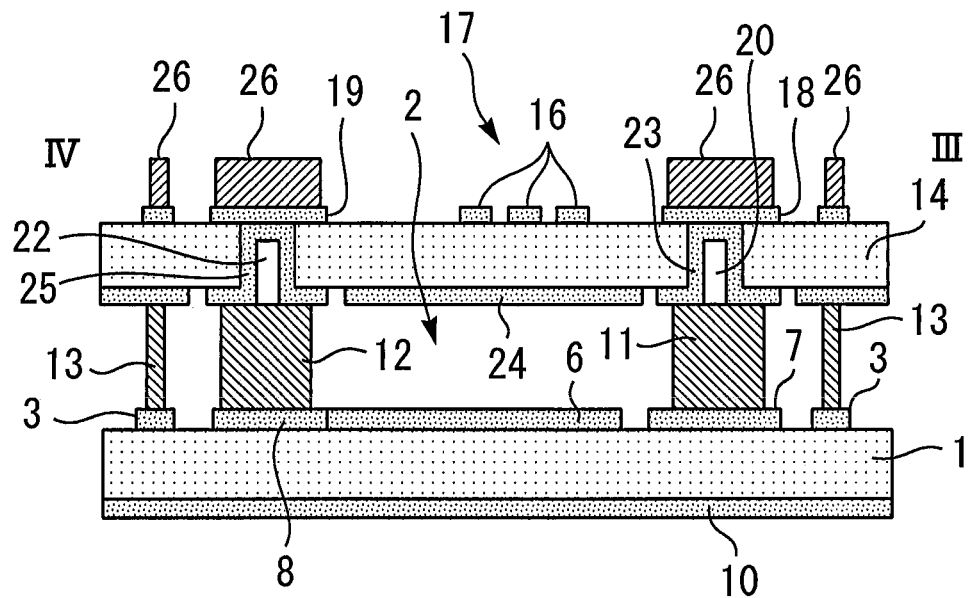
FIG. 3 is a sectional view along III-IV in FIG. 1.
Figure 4:
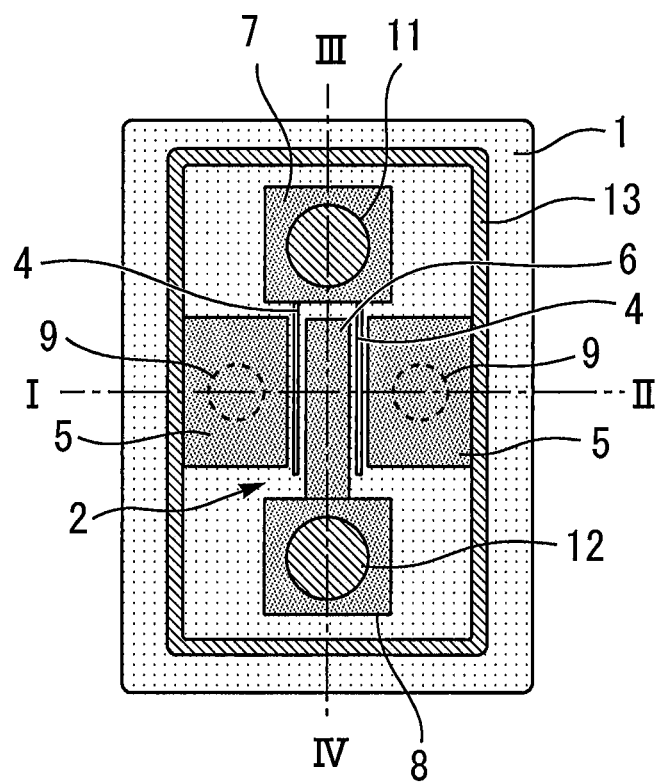
FIG. 4 is a top view illustrating a substrate according to embodiment 1.
Figure 5:
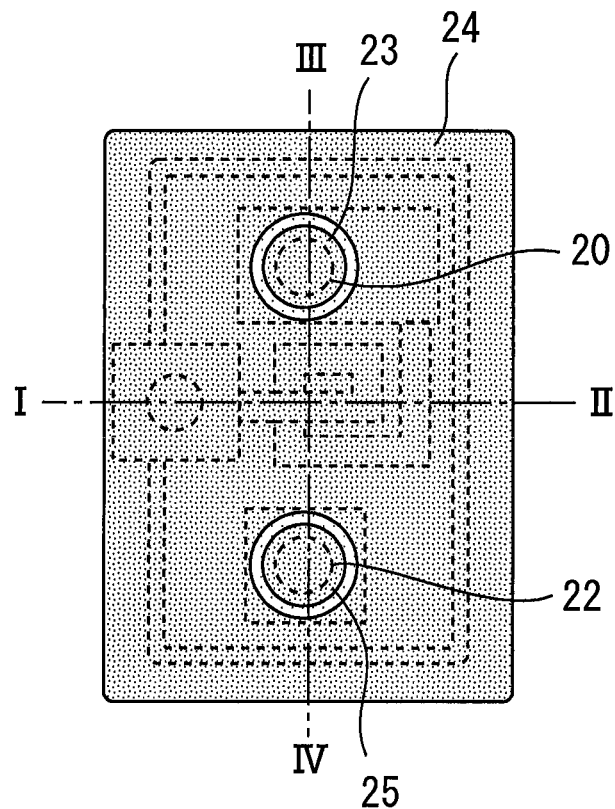
FIG. 5 is a bottom view illustrating a counter substrate according to embodiment 1.

FIG. 1 is a top view illustrating a substrate bonding structure according to embodiment 1. FIG. 2 is a sectional view along I-II in FIG. 1. FIG. 3 is a sectional view along III-IV in FIG. 1. FIG. 4 is a top view illustrating a substrate according to embodiment 1. FIG. 5 is a bottom view illustrating a counter substrate according to embodiment 1. Here, an example in which the substrate bonding structure is applied to a power amplifier using a GaN-HEMT transistor will be described. However, the present disclosure is not limited to the transistor, circuits, a substrate type and the like shown in the example. Further, materials and sizes are only examples, and do not limit a use range.

A substrate 1 is obtained by heteroepitaxially growing a GaN—AlGaN layer on a single crystal substrate of SiC or Si, for example. A device 2 that is a HEMT transistor is formed on a center of a main surface of the substrate 1. A sealing frame receiving pad 3 is formed to surround the device 2.

The device 2 has a gate electrode 4, a source electrode 5, a drain electrode 6, a gate pad 7 connected to the gate electrode 4, and a drain pad 8 connected to the drain electrode 6. The source electrode 5 also functions as a source pad. A signal voltage is received from the gate pad 7, a current is supplied from the source electrode 5, and a signal current is outputted from the drain pad 8.

A width of the single gate electrode 4 is approximately 50 to 500 μm, and a plurality of gate electrodes 4 are arranged in parallel laterally in accordance with a required output power. Though a case where the two gate electrodes 4 are arranged is shown here, approximately two to 100 gate electrodes 4 are arranged in reality. A size of the device 2 depends on a single gate width, and a number of gates, and when the single gate width is 500 μm, and the number of gates is 70, the size is approximately 1 mm long and 3 mm wide. The smaller a gate length, which is the lateral width of the gate electrode 4, the better the signal characteristics. For example, the gate electrode 4 has a lateral width of 0.1 to 1.0 and has a two-layer structure in which a Ti film of a thickness of 20 nm and an Al film of a thickness of 200 nm are sequentially formed by a vapor deposition method. The drain electrode 6 and the source electrode 5 are in ohmic contact with a GaN epitaxial layer on the substrate 1, and are formed by forming an Ni film of a thickness of 50 nm and an Au film of a thickness of 500 nm by a vapor deposition method, and forming an Au film of a thickness of 1 to 10 μm thereon by plating. A thickness of the Au film is selected in accordance with a current to be passed to the electrode. The gate pad 7 and the drain pad 8 are formed of a Ti film of a thickness of 500 nm, and an Au film of a thickness of 1 to 10 μm, and are connected to the drain electrode 6 and the gate electrode 4, respectively.

A via 9 penetrating through the substrate 1 is formed from a back surface side of the substrate 1 by dry etching. A thickness of the substrate 1 is approximately 50 to 100 μm, and a diameter of the via 9 is 50 to 100 μmϕ. A back electrode 10 is formed in the via 9 and a back surface of the substrate 1. The back electrode 10 is formed by forming Au plating of a thickness of 1 to 10 μm in accordance with a current to be passed into the via 9, on a seed film such as a sputter film of a Ti film of a thickness of 50 nm and an Au film of a thickness of 200 nm.

Connection bumps 11 and 12 are respectively formed on the gate pad 7 and the drain pad 8. A sealing frame 13 is formed on the sealing frame receiving pad 3. The sealing frame 13 is connected to the source electrode 5. The main surface of the substrate 1 and an undersurface of the counter substrate 14 are bonded to each other in a hollow state via the connection bumps 11 and 12 and the sealing frame 13. In other words, the main surface of the substrate 1 and the undersurface of the counter substrate 14 are separated from each other, and a space is configured on the device 2, and is supported by the connection bumps 11 and 12 and the sealing frame 13. The sealing frame 13 surrounds the device 2 and hermetically seals the space, and thereby reliability is enhanced. Note that the sealing frame 13 does not always have to be formed. Heights of the connection bumps 11 and 12 and the sealing frame 13 are set so that the device 2 on a substrate 1 side and the counter substrate 14 do not contact each other, and are approximately 10 μm, for example.

The counter substrate 14 is an insulating substrate of sapphire, glass, InP, SiC, GaAs or the like, an Si high resistance substrate, or the like. A circuit 17 having an MIM capacitor 15 and a spiral inductor 16, a gate extraction electrode 18, and a drain extraction electrode 19 are formed on a top surface of the counter substrate 14. The circuit 17 is a matching circuit, and is a harmonic processing circuit connected to an input side of the transistor in this case. The circuit 17 is composed of vapor deposition films of a Ti film of a thickness of 50 nm and an Au film of a thickness of 1 μm, and an Au plating film of a thickness of 1 to 5 μm.

Vias 20, 21 and 22 penetrating through the counter substrate 14 are formed from a back surface side of the counter substrate 14 by dry etching. A thickness of the counter substrate 14 is approximately 50 to 100 μm, and diameters of the vias 20, 21 and 22 are 50 to 100 μmϕ. An electrode 23 is formed in the via 20. A shield electrode 24 is formed in the via 21 and a back surface of the counter substrate 14. An electrode 25 is formed in the via 22. The electrodes 23 and 25 and the shield electrode 24 are formed by forming Au plating of a thickness of 1 to 5 μm in accordance with a current to be passed into the vias 20, 21 and 22, on seed films such as a sputter film of a Ti film of a thickness of 50 nm and an Au film of a thickness of 200 nm. In order to insulate the connection bumps 11 and 12 that are connected to a gate and drain from the shield electrode 24, the electrodes 23 and 25 and the shield electrode 24 are separated by patterning after formation of the plating film and the sputter films.

The gate extraction electrode 18 is connected to the gate pad 7 on the substrate 1 side via the electrode 23 and the connection bump 11. The gate extraction electrode 18 is connected to the shield electrode 24 via the MIM capacitor 15, and the spiral inductor 16 separately. The shield electrode 24 is connected to the back electrode 10 which is ground via the sealing frame 13 and the source electrode 5. Harmonic processing is enabled by a circuit from the gate extraction electrode 18 to the ground. Further, the shield electrode 24 shields an electromagnetic wave generated from the device 2 on the substrate 1 side so that the electromagnetic wave does not go outside from the hollow part.

The drain extraction electrode 19 is connected to the drain pad 8 on the substrate 1 side via the electrode 25 and the connection bump 12. A signal is inputted to the gate extraction electrode 18 by wire bond, and a signal is outputted from the drain extraction electrode 19 by wire bond. In this way, the device 2 of the substrate 1 and the circuit 17 of the counter substrate 14 are connected to each other via the connection bumps 11 and 12 and the sealing frame 13.

Bump structures 26 are formed on the top surface of the counter substrate 14 by Au plating of approximately 10 μm. The bump structures 26 are positioned in regions corresponding to at least the connection bumps 11 and 12 and the sealing frame 13, and have higher heights than that of the circuit 17.

Figure 6:
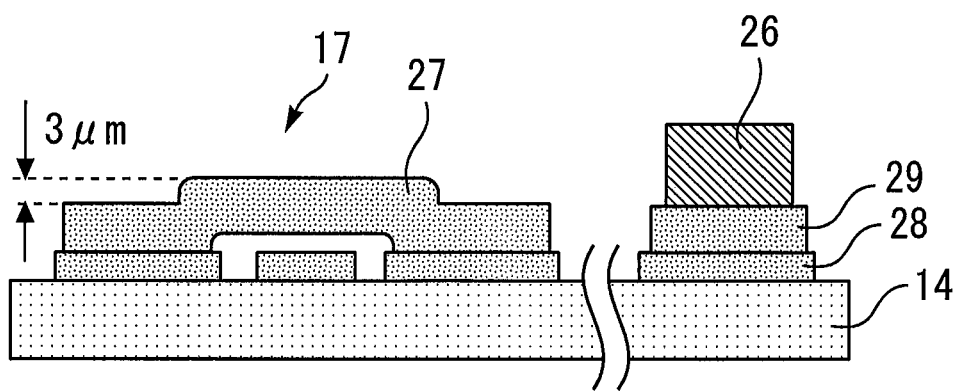
FIG. 6 is a sectional view illustrating a relationship between the air bridge and the bump structure.
Figure 7:
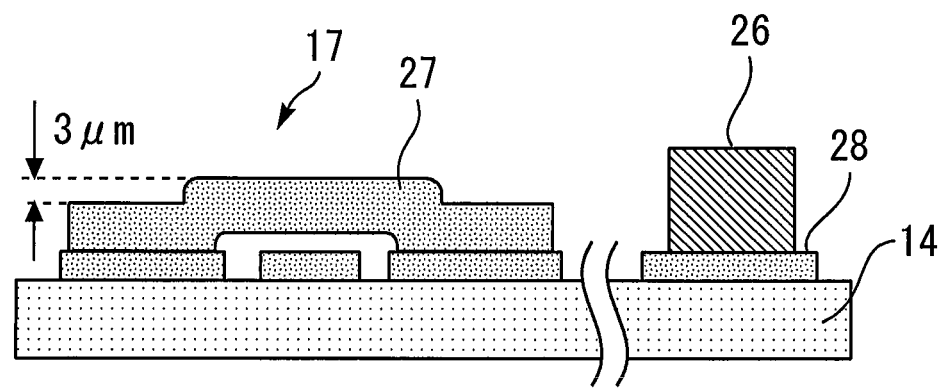
FIG. 7 is a sectional view illustrating a relationship between the air bridge and the bump structure.

FIG. 6 and FIG. 7 are sectional views each illustrating a relationship between the air bridge and the bump structure. For example, when the circuit 17 is a matching circuit of a power amplifier of GaN-HEMT, there is an intersection portion of wires called an air bridge 27. The wires are separated by approximately 3 μm via an air layer by the air bridge 27 to reduce a capacity between the wires, and therefore the air bridge 27 is higher by 3 μm than surrounding wires. The bump structure 26 needs to be made higher than that of the air bridge 27. When the bump structure 26 is formed on a stacked structure of the vapor deposition film 28 and the plating film 29 as in FIG. 6, a height of the bump structure 26 needs to be made larger than 3 μm. When the bump structure 26 is formed on the vapor deposition film 28 as in FIG. 7, the height of the bump structure 26 needs to be made larger than a plating thickness +3 μm. Although a case where the circuit 17 is formed on only the top surface of the counter substrate 14, and only the shield electrode 24 is formed on the back surface is shown here, another circuit may be formed on the back surface of the counter substrate 14. Further, although an example in which the MIM capacitor 15 and the spiral inductor 16 are placed as the circuit 17 on the top surface is shown, the circuit 17 also includes a wiring structure electrically connecting elements, and a connection portion connecting elements.

Subsequently, a substrate bonding method according to the present embodiment will be described. FIG. 8 to FIG. 11 are sectional views each illustrating an example of a production process on a substrate side according to embodiment 1. These drawings correspond to the sectional view along III-IV in FIG. 4. In the example, the connection bumps 11 and 12 and the sealing frame 13 are formed by Au plating. Note that the connection bumps 11 and 12 and the sealing frame 13 may be formed by a patterning process by deposition lift-off.

Figure 8:
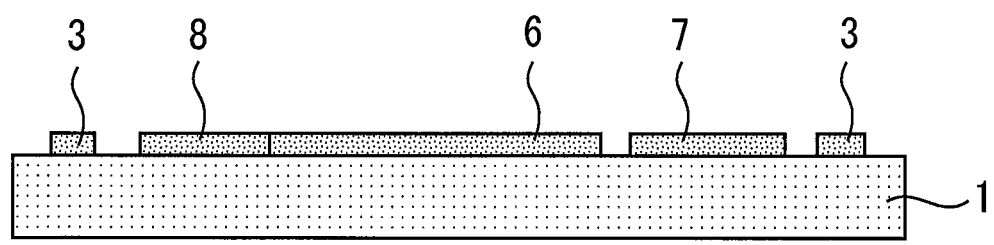
FIG. 8 is a sectional views illustrating an example of a production process on a substrate side according to embodiment 1.

First, as illustrated in FIG. 8, on the main surface of the substrate 1, the device 2 having the drain electrode 6 and the like, the gate pad 7, the drain pad 8 and the sealing frame receiving pad 3 are formed as receiving pads. Note that the vias 9 and the back electrode 10 are also formed on the substrate 1, but illustrations of the vias 9 and the back electrode 10 are omitted in FIG. 8 to FIG. 14. Note that the gate pad 7, the drain pad 8, and the drain electrode 6 are described to have the same thickness, but this is a simplified illustration, and the drain electrode 6 is thicker than those of the other electrodes because the drain electrode 6 includes an ohmic layer in a lower layer. The gate pad 7, the drain pad 8 and the sealing frame receiving pad 3 are not always necessary, but are desired to be formed as foundations of the connection bumps 11 and 12, and the sealing frame 13. Thereby, the heights of the connection bumps 11 and 12 and the sealing frame 13 are uniform, and the bonding property is improved. Further, by using some of the electrodes of the device 2 as the pads, electrical connection of both becomes easy.

As for the receiving pad, a material such as Ti having good adhesion to the substrate 1, and a material having good adhesion to the connection bumps 11 and 12 and the sealing frame 13 are continuously deposited by vapor deposition or the like. When the connection bumps 11 and 12 and the sealing frame 13 are formed from Au, for example, the receiving pads are formed by continuous deposition of Ti/Au. Further, the receiving pads are formed simultaneously with the electrodes of the device 2 during device formation. Note that as the ohmic electrode, Ni/Au or the like is necessary in the lower layer of the drain electrode 6 to configure the device. However, layer configurations of the receiving pads are desirably same because bonding is not stable when the heights of the connection bumps 11 and 12 and the sealing frame 13 are not uniform.

Figure 9:
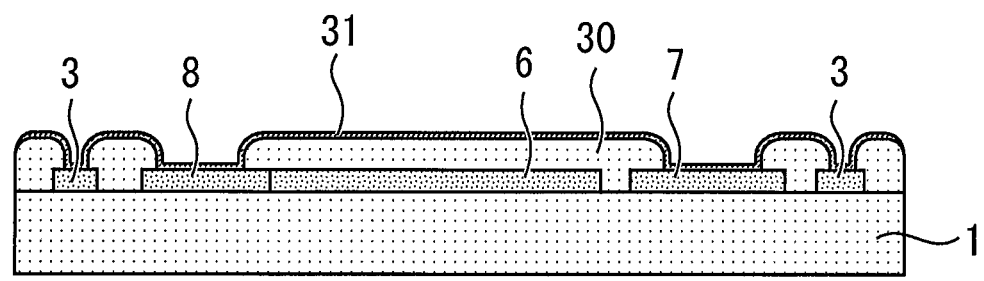
FIG. 9 is a sectional views illustrating an example of a production process on a substrate side according to embodiment 1.
Figure 10:
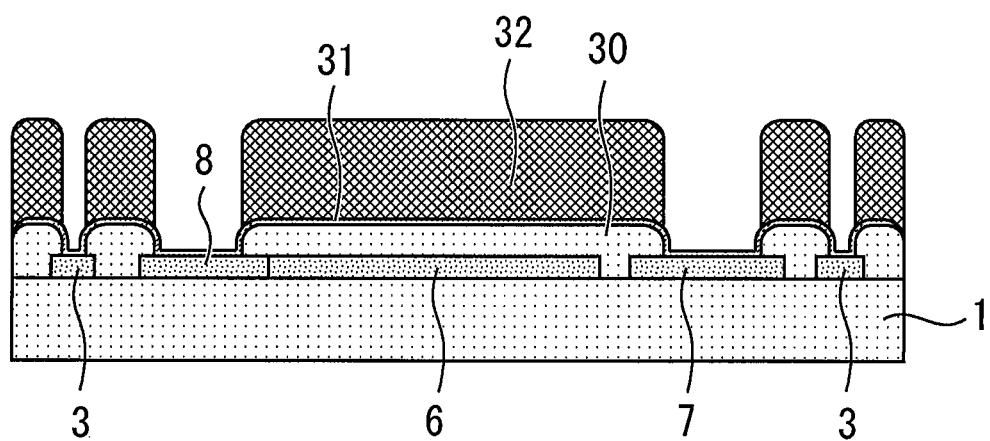
FIG. 10 is a sectional views illustrating an example of a production process on a substrate side according to embodiment 1.

Next, as illustrated in FIG. 9, a lower layer resist 30 is formed and is patterned. Next, a power supply layer 31 of plating is formed on an entire surface. Next, as illustrated in FIG. 10, an upper layer resist 32 is formed and is patterned.

Figure 11:
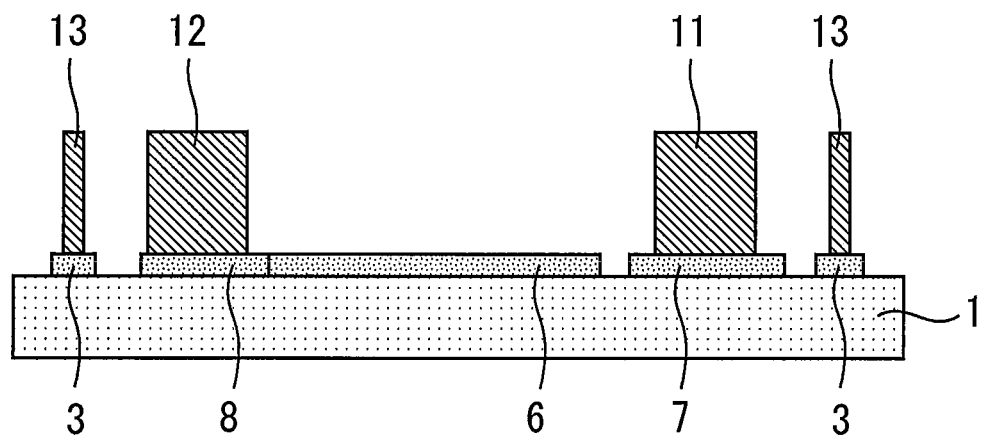
FIG. 11 is a sectional views illustrating an example of a production process on a substrate side according to embodiment 1.

Next, an Au plating film is formed only in opening portions of the upper layer resist 32 by electric plating. Note that in Au plating on a wafer, an apparatus is configured so that a plating liquid is circulated to make a liquid flow uniform on a wafer surface, and an electric field also becomes uniform within a wafer plane, whereby in-plane distribution of a plating thickness is made uniform. Good bonding cannot be obtained when the plating thickness varies, and therefore the plating process is important. Thereafter, the upper layer resist 32, the power supply layer 31, and the lower layer resist 30 are removed, and thereby the connection bumps 11 and 12 and the sealing frame 13 are obtained as illustrated in FIG. 11.

Figure 12:
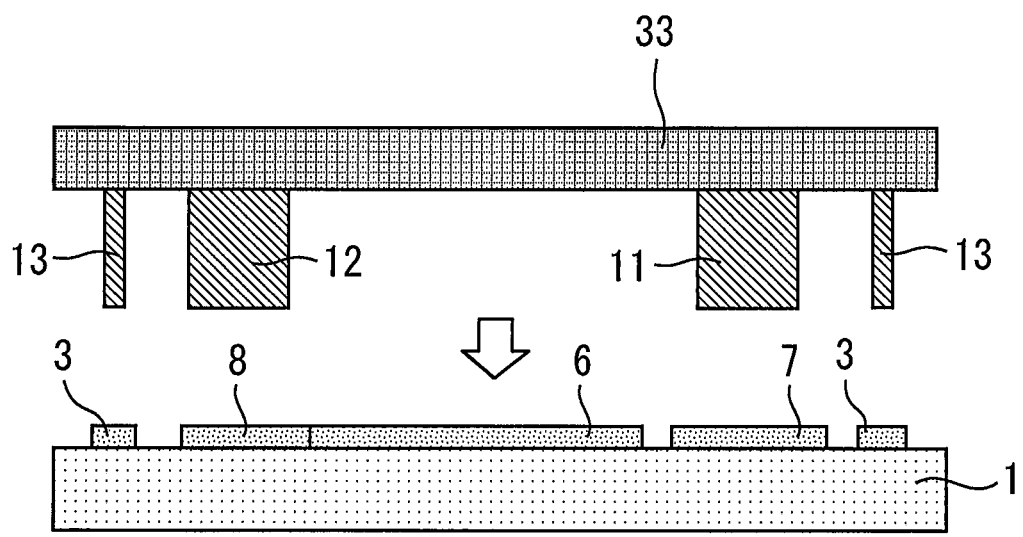
FIG. 12 is a sectional view illustrating another example of the production process on the substrate side according to embodiment 1.
Figure 13:
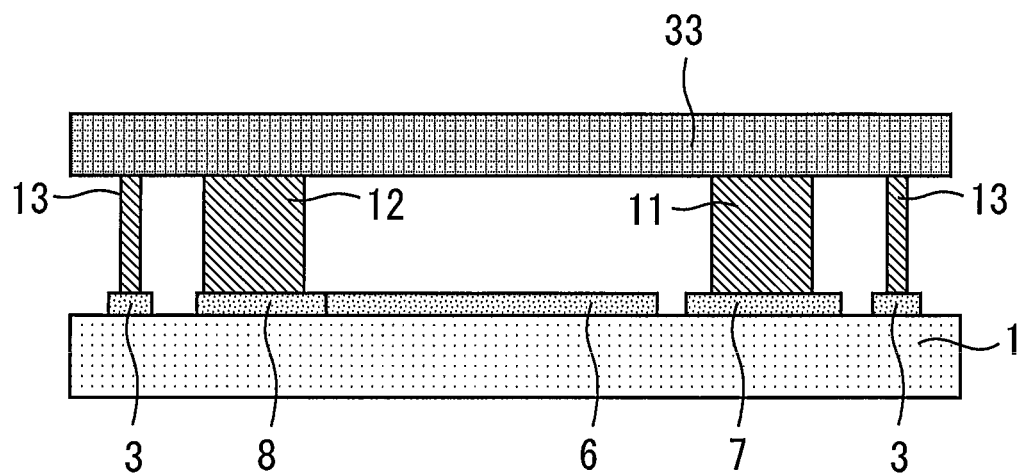
FIG. 13 is a sectional view illustrating another example of the production process on the substrate side according to embodiment 1.
Figure 14:
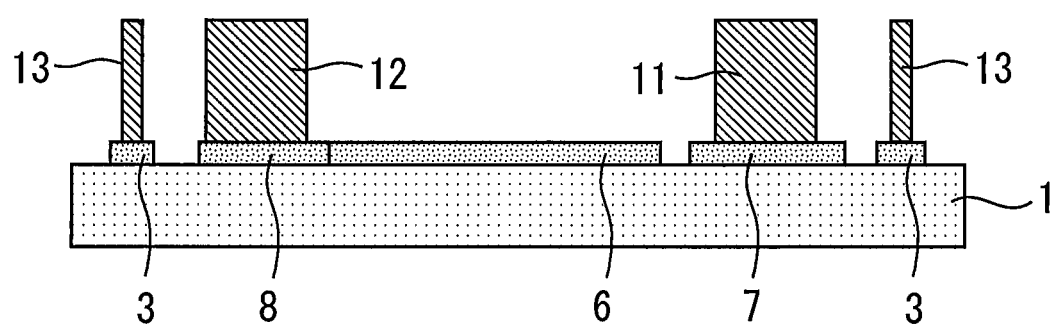
FIG. 14 is a sectional view illustrating another example of the production process on the substrate side according to embodiment 1.

FIG. 12 to FIG. 14 are sectional views each illustrating another example of the production process on the substrate side according to embodiment 1. In the example, the connection bumps 11 and 12 and the sealing frame 13 are formed by using metal particle paste. Metal particle paste is a material prepared by mixing metal particles with a solvent.

First, a device 2, a gate pad 7, a drain pad 8, and a sealing frame receiving pad 3 are formed on a main surface of a substrate 1 as in FIG. 8. Next, another transferring substrate 33 is prepared, and patterns corresponding to the connection bumps 11 and 12 and the sealing frame 13 are formed on the transferring substrate 33. Formation methods include a method in which after the metal particle paste is filled in the pattern by using resist or a mask, the resist or the mask is removed, or the like. After pattern formation, baking is performed, and a solvent component contained in the paste agent is evaporated. A temperature of baking is approximately 100 to 200° C. in the case of Au paste. As a result, a structure in which metal particles are aggregated is formed, but at this stage, the metal particles are not integrated, and a large number of voids exist among the particles. Note that it is empirically known that in the case of Au particle paste, a volume ratio of the particles and voids is approximately 1:1.

Next, as illustrated in FIG. 13, the pattern on the substrate 1 and the pattern on the transferring substrate 33 are aligned and are thereafter heated, the substrate 1 and the transferring substrate 33 are pressurized from both sides to bond the connection bumps 11 and 12 and the sealing frame 13 to the pads on the substrate 1 side. At a time of pressurizing, the connection bumps 11 and 12 and the sealing frame 13 formed from the metal particle paste are compressed and deformed, and the voids are decreased. An amount of the deformation varies according to pressure and a temperature at the time of pressurizing, and is approximately 0 to 20% of an original height when the Au particle paste is pressurized at 30 MPa at 150° C., for example. In the case of the pattern of a height of 20 μm, the height is reduced by approximately 0 to 4 μm. As a result, the connection bumps 11 and 12 and the sealing frame 13 can be flexibly deformed and adhere to nonuniformity in the heights of the receiving pads or micron-level unevenness on surfaces. For example, when the receiving pads are each formed to have a thickness of 10 μm by plating, height distributions of several micrometers appear depending on the pattern size or the in-plane distribution of the wafer, but the metal particle paste patterns formed on the receiving pads can absorb the height distributions to make the heights uniform. Further, for example, even when the receiving pad 3 is a plating film of a thickness of 10 μm, and the gate pad 7 and the drain pad 8 are each made by stacking a vapor deposition film of a thickness of 2 μm and a plating film of a thickness of 10 μm, contraction amounts of the paste agent change in the respective locations, which can make entire heights including the pads uniform. The heights are made uniform, and thereby adhesion, sealability and electrical connectivity are enhanced when the substrate 1 and the counter substrate 14 are bonded to each other.

In the end, the transferring substrate 33 is removed, and thereby the production process on the substrate side is completed. When a material such as Ti having low adhesion to the metal particle paste agent is coated on the substrate surface, the transferring substrate 33 is easily removed. Note that the metal particle paste pattern may be formed on an undersurface side of the counter substrate 14 without being limited to the main surface side of the substrate 1.

Figure 15:
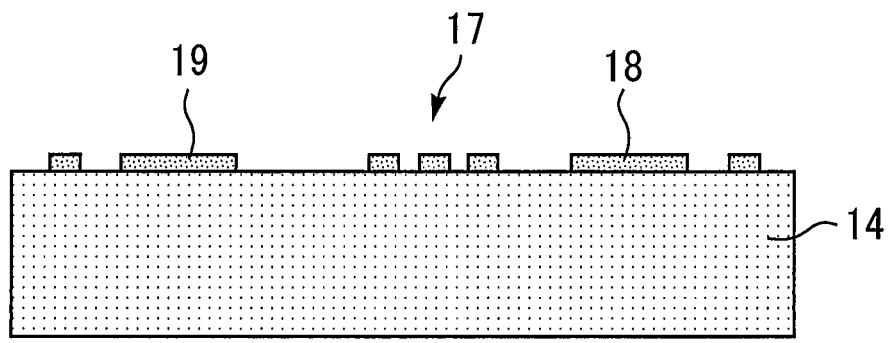
FIG. 15 is a sectional view illustrating a production process on a counter substrate side according to embodiment 1.

FIG. 15 to FIG. 18 are sectional views each illustrating a production process on a counter substrate side according to embodiment 1. First, as illustrated in FIG. 15, the circuit 17 is formed on the top surface of the counter substrate 14. Here, the circuit 17 is shown by a metal pattern of a single layer, but in reality, the circuit 17 is composed of a plurality of metal patterns. Further, in order to enhance insulation among the patterns or moisture resistance reliability, an insulation film such as a silicon oxide film is formed by a CVD method or the like, but is not illustrated.

Figure 16:
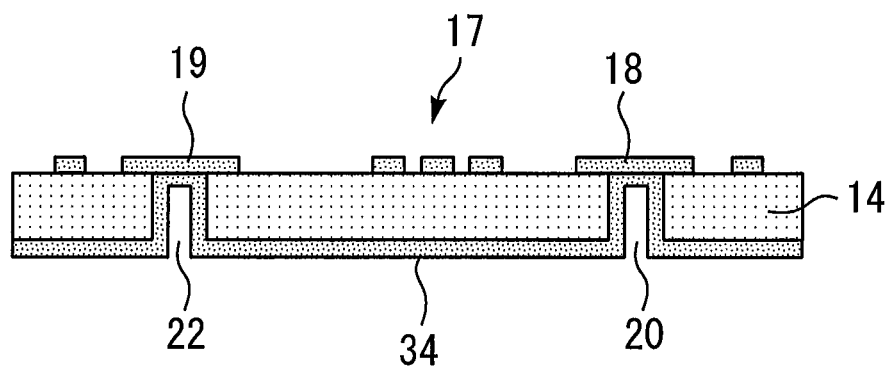
FIG. 16 is a sectional view illustrating a production process on a counter substrate side according to embodiment 1.
Figure 17:
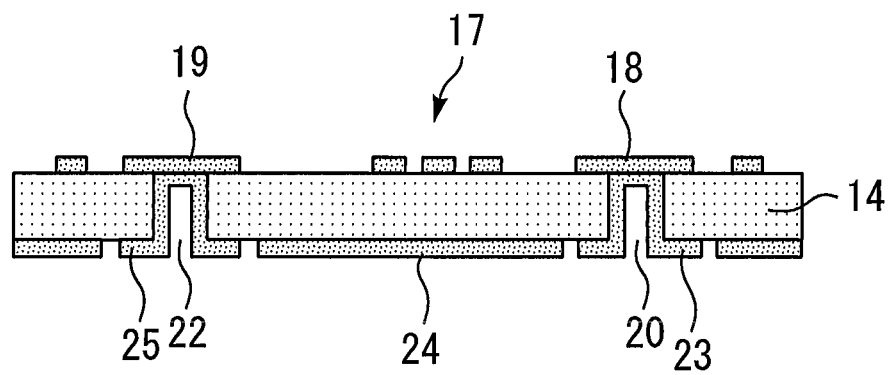
FIG. 17 is a sectional view illustrating a production process on a counter substrate side according to embodiment 1.

Next, as illustrated in FIG. 16, the undersurface of the counter substrate 14 is ground, or polished to be made thin. Vias 20, 21, and 22 are formed by dry etching or the like from an undersurface side of the counter substrate 14, a power supply layer is formed by a sputter method, and thereafter, an electrode 34 of a thick film is formed by plating. Next, as illustrated in FIG. 17, the electrodes 23 and 25 and the shield electrode 24 are formed by patterning with a resist, and etching unnecessary portions of the electrode 34.

Figure 18:
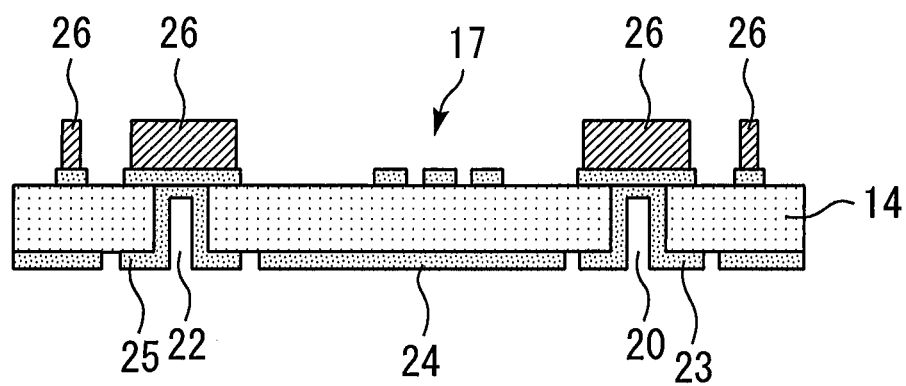
FIG. 18 is a sectional view illustrating a production process on a counter substrate side according to embodiment 1.

Next, as illustrated in FIG. 18, the bump structures 26 are formed on the top surface of the counter substrate 14. The bump structures 26 are patterns corresponding to the connection bumps 11 and 12 and the sealing frame 13, and are formed to have a height higher than that of the circuit 17. Note that formation of the bump structures 26 may be performed directly after formation of the circuit 17, and formation by etching of the vias 20, 21 and 22 from the undersurface, and formation of the electrode 34 are shown by way of example only.

Figure 19:
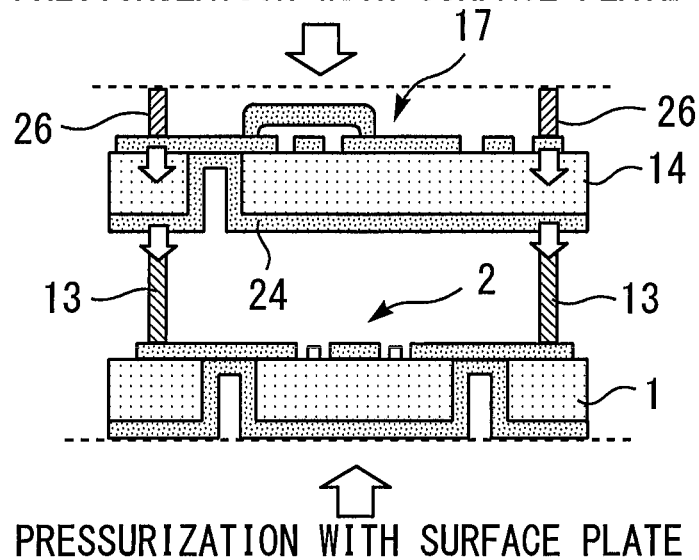
FIG. 19 is a sectional view illustrating a bonding process of the substrate and the counter substrate according to embodiment 1.

FIG. 19 is a sectional view illustrating a bonding process of the substrate and the counter substrate according to embodiment 1. First, the main surface of the substrate 1 in a wafer state and the undersurface of the counter substrate 14 in a wafer state are aligned. The substrate 1 and the counter substrate 14 are bonded together by performing pressurization and heating with surface plates that are flat and parallel from above and below. At this time, the bump structures 26 are pressurized with the surface plate so that the surface plate does not contact the circuit 17, and the main surface of the substrate 1 and the undersurface of the counter substrate 14 are bonded to each other via the connection bumps 11 and 12 and the sealing frame 13. Adhesion surfaces of top surfaces of the connection bumps 11 and 12 and the sealing frame 13, and the electrodes 23 and 25 and the shield electrode 24 on the back surface of the counter substrate 14 are flat, and both are bonded under a high temperature and high pressure. Adhesion can be increased by cleaning the surface by performing plasma processing of Ar and $O_2$, and applying ultrasonic vibration. As the material of both, metals that bond to each other before reaching melting temperatures may be selected. For example, metals that easily cause a solid solution reaction include Au, In and the like, and noble metals such as Au, Pt, Ag and Pd can bond to each other at their surfaces even if they are of the same kind.

Pressurization and heating are performed under similar conditions as the process in FIG. 13. Thereby, voids in the connection bumps 11 and 12 and the sealing frame 13 formed from the metal particle paste are further narrowed, the metal particles further adhere to one another, and the particle surfaces are bonded to one another to form a bulk without reaching the melting temperature of the metal. For example, Au particle paste forms a bulk at 200° C. under 100 MPa. In the case of the pattern that originally has a height of 20 μm, the pattern is compressed to approximately 10 μm by bonding.

Figure 20:
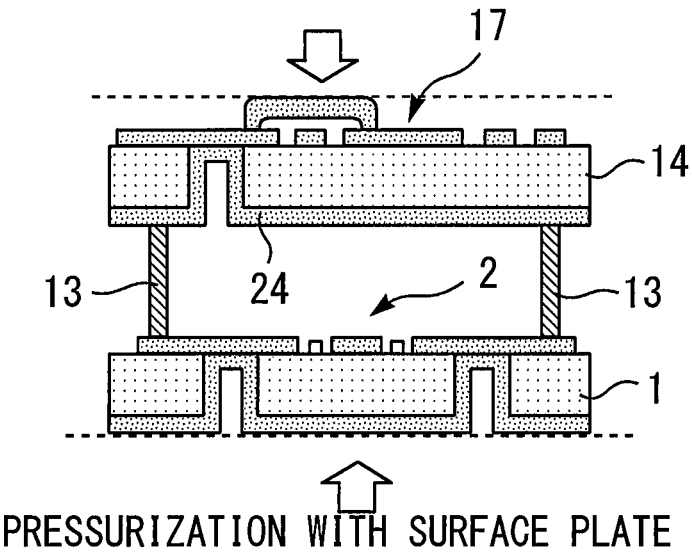
FIG. 20 is a sectional view illustrating a bonding process of a substrate and a counter substrate according to comparative example 1.

Subsequently, an effect of the present embodiment will be described by being compared with comparative examples 1 and 2. FIG. 20 is a sectional view illustrating a bonding process of a substrate and a counter substrate according to comparative example 1. Since there is no bump structure 26, a surface plate may contact to damage and deform an air bridge 27 and the like on a circuit 17.

In contrast with this, in the present embodiment, the bump structures 26 are formed on the top surface of the counter substrate 14, the bump structure 26 is disposed in positions corresponding to at least the connection bumps 11 and 12 and the sealing frame 13, and has the height higher than that of the circuit 17. Accordingly, when the substrate 1 and the counter substrate 14 are bonded together, the circuit 17 having a low height does not contact the surface plate, and therefore the circuit 17 can be protected. Further, a load from the surface plate on the upper side is not dispersed to the circuit 17, but transmitted linearly to the connection bumps 11 and 12 and the sealing frame 13 via the bump structure 26. Accordingly, a sufficient load can be applied, and therefore, adhesion of the counter substrate 14, and the connection bumps 11 and 12 and the sealing frame 13 can be ensured. As a result, reliability can be enhanced.

By ensuring adhesion of the counter substrate 14, and the connection bumps 11 and 12, reliability of the electric connection of both can be enhanced. Further, by ensuring adhesion of the counter substrate 14 and the sealing frame 13, hermetic sealability of the device can be enhanced. Note that pressure that is applied to the connection bumps 11 and 12 for the purpose of electric connection may be lower than pressure that is applied to the sealing frame 13 to enhance the hermetic sealability. Accordingly, the bump structure 26 is preferentially provided in a region corresponding to the sealing frame 13, and pressure at the time of bonding may be applied to the sealing frame 13 more strongly than to the connection bumps 11 and 12.

Figure 21:
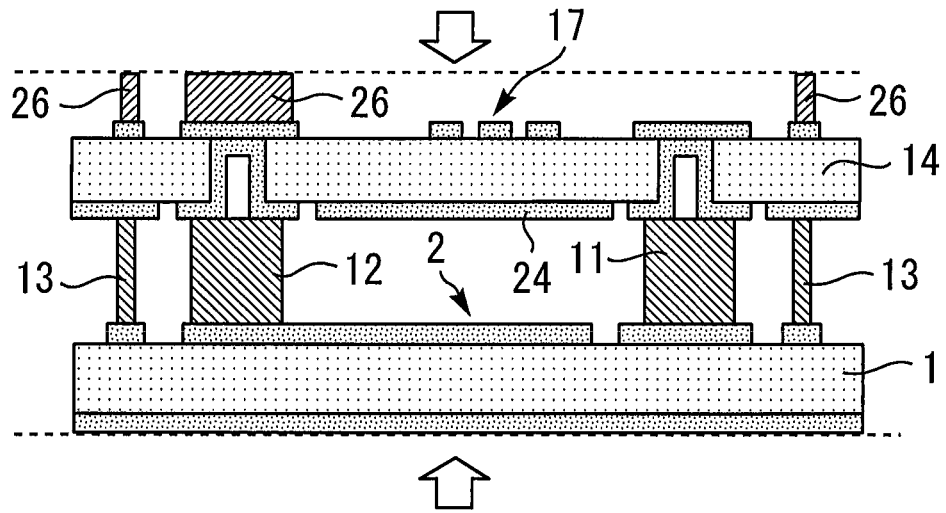
FIG. 21 is a sectional view illustrating a bonding process of a substrate and a counter substrate according to a comparative example 2.

FIG. 21 is a sectional view illustrating a bonding process of a substrate and a counter substrate according to a comparative example 2. There is a portion having no bump structure 26 in a region corresponding to a connection bump 11. Pressure from a surface plate is not transmitted linearly to the connection bump 11 corresponding to the portion, so that bonding pressure is low, and bonding becomes insufficient. Further, there is also a possibility that the counter substrate 14 deforms and a crack or the like occurs. Accordingly, the bump structures 26 are preferably positioned in regions corresponding to all of the connection bumps 11 and 12 and the sealing frame 13.

Figure 22:
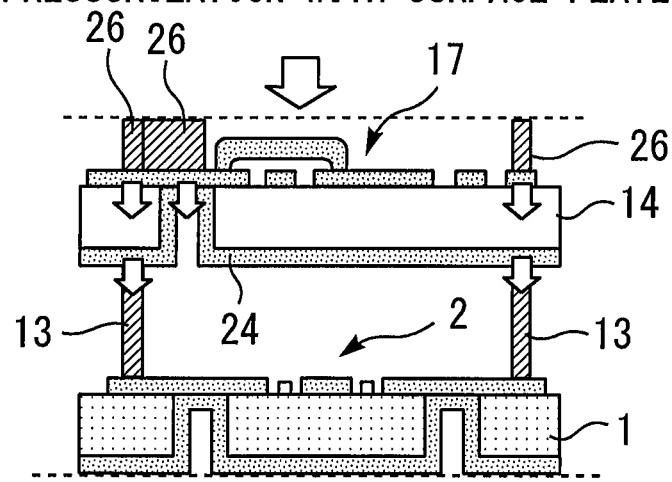
FIG. 22 is a sectional view illustrating a modified example of the substrate bonding structure according to embodiment 1.

FIG. 22 is a sectional view illustrating a modified example of the substrate bonding structure according to embodiment 1. When the bump structures 26 are disposed in the regions corresponding to connection bumps 11 and 12 and a sealing frame 13, the above described effect can be obtained, and part of the bump structures 26 may be partially positioned in a region other than the regions corresponding to the connection bumps 11 and 12 and the sealing frame 13. However, it is preferable that the bump structure 26 is not positioned in the region other than the regions corresponding to the connection bumps 11 and 12 and the sealing frame 13. Thereby, nonuniformity does not occur to the pressures from above and below to the counter substrate 14, and therefore, breakage or crack of the counter substrate 14 can be prevented.

Further, by forming the connection bumps 11 and 12 and the sealing frame 13 from the metal paste agent, the heights before bonding can be made uniform. Therefore, bonding can be performed stably within the wafer surface. Further, even when a difference exists in the heights of the receiving pads on the foundation, the heights of the connection bumps 11 and 12 and the sealing frame 13 can be made uniform. Consequently, there are few restrictions on the device 2. For example, it is possible to form a bonding bump on a drain electrode having an ohmic electrode, and at the same time, it is also possible to form a bonding bump on a gate pad where an ohmic electrode cannot be formed. Further, the metal particle paste includes metal particles, so that a surface area is larger as compared with a bulk metal formed by plating or the like, and bonding under a relatively low temperature and low pressure is possible. By bonding under a low temperature and low pressure, the device 2 that cannot withstand a high temperature can be formed.

Embodiment 2

Figure 23:
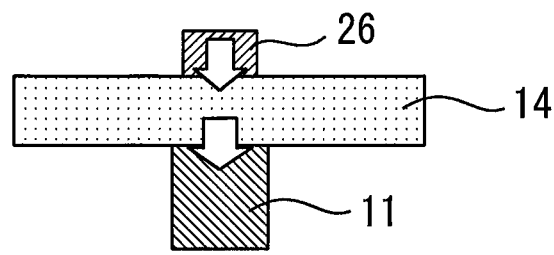
FIG. 23 is a sectional view illustrating a main part of a substrate bonding structure according to embodiment 2.

FIG. 23 is a sectional view illustrating a main part of a substrate bonding structure according to embodiment 2. A bump structure 26 has a sectional area smaller than that of a connection bump 11 or the like, and is positioned in a same region or inside of the region corresponding to the connection bump 11 or the like. In other words, the bump structure 26 is positioned in only the region corresponding to the connection bump 11 or the like. Thereby, forces that are applied to the bump structure 26 at the time of bonding are all applied to the connection bump 11 or the like, and therefore reliability of electric connection can be enhanced.

Embodiment 3

Figure 24:
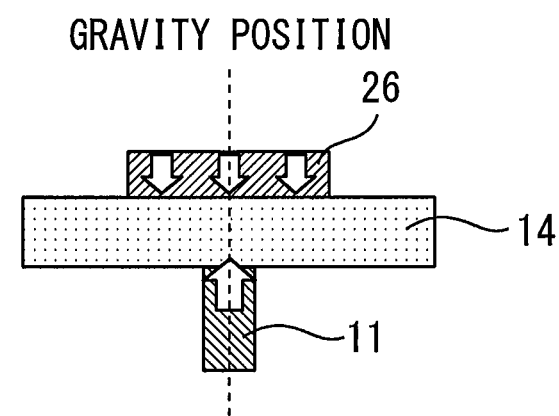
FIG. 24 is a sectional view illustrating a main part of a substrate bonding structure according to embodiment 3.

FIG. 24 is a sectional view illustrating a main part of a substrate bonding structure according to embodiment 3. In the present embodiment, a direction along the main surface of a substrate 1 and a top surface and an undersurface of the counter substrate 14 is set as a lateral direction, and center positions of gravity in the lateral direction of the bump structure 26 and the connection bump 11 or the like correspond to each other. Thereby, moment does not occur by a force that is applied to the counter substrate 14 from the bump structure 26 and the connection bump 11 or the like, so that a force that deforms the counter substrate 14 hardly works, and a damage to the counter substrate 14 by a crack or the like hardly occurs.

Figure 25:
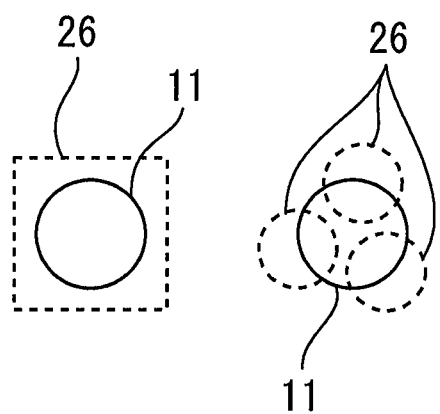
FIG. 25 is a plan view illustrating a positional relationship of the bump structure and a bonding member of the substrate bonding structure according to embodiment 3.

FIG. 25 is a plan view illustrating a positional relationship of the bump structure and a bonding member of the substrate bonding structure according to embodiment 3. When the center positions of gravity in the lateral direction of the bump structure 26 and the connection bump 11 or the like correspond to each other, the above described effect is obtained, and pattern shapes of the bump structure 26 and the connection bump 11 or the like may be different as in a view on a left side in FIG. 25, or numbers of divisions of the bump structure 26 and the connection bump 11 or the like may be different as in a right side view. Thereby, a degree of freedom of design of the bump structure 26 and the connection bump 11 or the like is increased.

REFERENCE SIGNS LIST 1 substrate; 2 device; 11,12 connection bump (bonding member); 13 sealing frame (bonding member); 14 counter substrate; 17 circuit; 26 bump structure

The invention claimed is:
1. A substrate bonding structure comprising:
a substrate having a main surface;
a device formed on the main surface of the substrate;
a counter substrate having an undersurface facing the main surface and a top surface opposite to the undersurface;
a bonding member bonding the main surface of the substrate to the undersurface of the counter substrate in a hollow state; and
a circuit and a bump structure formed on the top surface of the counter substrate,
wherein the bump structure has a higher height than a height of the circuit,
the bonding member includes a metal sealing frame formed to surround the device and hermetically seal a space on the device, and the bump structure positioned in a region corresponding to the metal sealing frame is formed to surround the device in plan view.

2. The substrate bonding structure according to claim 1, wherein the bonding member includes a connection bump bonding the device to the circuit.

3. The substrate bonding structure according to claim 2, wherein the bump structure is positioned in a region corresponding to at least the bonding member.

4. The substrate bonding structure according to claim 1, wherein the bump structure is positioned in a region corresponding to at least the bonding member.

5. A method for bonding substrates comprising:
forming a device on a main surface of a substrate;
forming a bonding member on the main surface of the substrate;
forming, on a counter substrate, a circuit and a bump structure that is positioned in a region corresponding to at least the bonding member and has a higher height than a height of the circuit; and
pressurizing the bump structure with a surface plate so that the surface plate does not contact the circuit and bonding the main surface of the substrate to the undersurface of the counter substrate via the bonding member in a hollow state.

6. The method for bonding substrates according to claim 5, wherein the bonding member is formed by plating.

7. The method for bonding substrates according to claim 5, wherein the bonding member is formed by using metal particle paste.

8. The method according to claim 5, wherein
the pressurizing bonds the main surface of the substrate to the undersurface of the counter substrate via the bonding member in the hollow state to hermetically seal a space on the device with a sealing frame surrounding the device.

9. A substrate bonding structure comprising:
a substrate having a main surface;
a device formed on the main surface of the substrate;
a counter substrate having an undersurface facing the main surface and a top surface opposite to the undersurface;
a connection bump extending from the main surface of the substrate to the undersurface of the counter substrate and bonding the main surface of the substrate to the undersurface of the counter substrate in a hollow state; and
a circuit and bump structures formed on the top surface of the counter substrate,
wherein the connection bump connects the device to the circuit,
the bump structures are positioned in a region corresponding to at least the connection bump, and have a higher height than a height of the circuit, and
at least one of the bump structures has a different shape in plan view from the corresponding connection bump, and has a center position of gravity in plan view corresponding to that of the corresponding connection bump.

10. A substrate bonding structure comprising:
a substrate having a main surface;
a device formed on the main surface of the substrate;
a counter substrate having an undersurface facing the main surface and a top surface opposite to the undersurface;
a connection bump extending from the main surface of the substrate to the undersurface of the counter substrate and bonding the main surface of the substrate to the undersurface of the counter substrate in a hollow state; and
a circuit and bump structures formed on the top surface of the counter substrate,
wherein the connection bump connects the device to the circuit,
the bump structures are positioned in a region corresponding to at least the connection bump, and have a higher height than a height of the circuit, and
at least one of the bump structures is composed of multiple members, and has a center position of gravity in plan view corresponding to that of the corresponding connection bump.

\* \* \* \* \*